(12) United States Patent
Doebber et al.

(10) Patent No.: US 11,492,692 B2
(45) Date of Patent: Nov. 8, 2022

(54) THERMAL BARRIER COATING WITH HIGH CORROSION RESISTANCE

(71) Applicant: MTU Aero Engines AG, Munich (DE)

(72) Inventors: Philipp Doebber, Hannover (DE); Frank Seidel, Grossburgwedel (DE)

(73) Assignee: MTU AERO ENGINES AG, Munich (DE)

( * ) Notice: Subject to any disclaimer, the term of this patent is extended or adjusted under 35 U.S.C. 154(b) by 325 days.

(21) Appl. No.: 15/425,451

(22) Filed: Feb. 6, 2017

(65) Prior Publication Data

US 2017/0226621 A1  Aug. 10, 2017

(30) Foreign Application Priority Data

Feb. 10, 2016 (DE) .......................... 102016201947.3

(51) Int. Cl.
*B32B 9/00* (2006.01)
*C23C 4/12* (2016.01)
(Continued)

(52) U.S. Cl.
CPC ................. *C23C 4/12* (2013.01); *C23C 4/11* (2016.01); *C23C 4/18* (2013.01); *C23C 14/221* (2013.01); *C23C 28/321* (2013.01); *C23C 28/3215* (2013.01); *C23C 28/3455* (2013.01); *F01D 5/288* (2013.01); *F01D 9/02* (2013.01); *F05D 2220/32* (2013.01); *F05D 2230/311* (2013.01); *F05D 2230/313* (2013.01);
(Continued)

(58) Field of Classification Search
None
See application file for complete search history.

(56) References Cited

U.S. PATENT DOCUMENTS 4,193,954 A * 3/1980 Speronello ............ C04B 35/113
264/13
4,847,064 A * 7/1989 Pearson .................. C01F 7/144
423/625

(Continued)

FOREIGN PATENT DOCUMENTS

DE         19680259 T5    6/1997
DE      102013217627 A1   3/2015

(Continued)

OTHER PUBLICATIONS

Chen et al., Thermal cycling failure of new LaMgAl11O19/YSZ double ceramic top thermal barrier coating systems, Nov. 30, 2010, Surface & Coatings Technology, 3293-3300 (Year: 2010).*

(Continued)

*Primary Examiner* — Mary I Omori
(74) *Attorney, Agent, or Firm* — Abel Schillinger, LLP

(57) ABSTRACT

Disclosed is a thermal barrier coating system for components of a turbomachine, especially for high temperature-stressed or hot gas-stressed components of a turbomachine, comprising a ceramic coating of fully or partially stabilized zirconium oxide, and an oxide cover coating which comprises aluminum and at least one element from the group lanthanum, magnesium, silicon, calcium and sodium. The aluminum oxide exists at least partially as free $\alpha$-$Al_2O_3$. Also disclosed is a method for producing a corresponding thermal barrier coating system.

20 Claims, 1 Drawing Sheet

(51) Int. Cl.
    *C23C 28/00*   (2006.01)
    *C23C 4/18*    (2006.01)
    *C23C 4/11*    (2016.01)
    *C23C 14/22*   (2006.01)
    *F01D 5/28*    (2006.01)
    *F01D 9/02*    (2006.01)

(52) U.S. Cl.
    CPC ...... *F05D 2230/90* (2013.01); *F05D 2240/24* (2013.01); *F05D 2240/35* (2013.01); *F05D 2300/222* (2013.01); *F05D 2300/514* (2013.01); *Y02T 50/60* (2013.01)

(56) References Cited

U.S. PATENT DOCUMENTS

| | | | |
|---|---|---|---|
| 5,080,977 | A | 1/1992 | Zaplatynsky |
| 5,660,885 | A | 8/1997 | Hasz et al. |
| 5,683,761 | A * | 11/1997 | Bruce ............... C23C 4/02 427/255.7 |
| 6,165,600 | A * | 12/2000 | Ivkovich, Jr. ........... B32B 18/00 123/1 R |
| 6,602,814 | B1 * | 8/2003 | Gadow ................ C01G 25/02 252/62 |
| 6,720,038 | B2 | 4/2004 | Darolia et al. |
| 8,017,230 | B2 | 9/2011 | Taylor |
| 9,034,479 | B2 | 5/2015 | Nagaraj et al. |
| 2003/0152797 | A1 | 8/2003 | Darolia et al. |
| 2005/0282020 | A1 * | 12/2005 | Stowell ................. C23C 24/08 428/446 |
| 2008/0113095 | A1 | 5/2008 | Gorman et al. |
| 2008/0190034 | A1 * | 8/2008 | Rosenflanz ......... C04B 35/6261 501/48 |
| 2009/0110903 | A1 | 4/2009 | Margolies |
| 2009/0169914 | A1 | 7/2009 | Fu et al. |
| 2010/0081558 | A1 | 4/2010 | Taylor |
| 2010/0247953 | A1 | 9/2010 | Bossmann et al. |
| 2011/0151132 | A1 | 6/2011 | Nagaraj et al. |
| 2011/0151219 | A1 | 6/2011 | Nagaraj et al. |
| 2014/0220378 | A1 | 8/2014 | Nagaraj et al. |
| 2015/0064430 | A1 | 3/2015 | Doebber |

FOREIGN PATENT DOCUMENTS

| | | |
|---|---|---|
| EP | 1335040 B1 | 8/2007 |
| EP | 2233450 A1 | 9/2010 |
| EP | 2766504 B1 | 12/2015 |
| EP | 1951926 B1 | 10/2016 |

OTHER PUBLICATIONS

Jiri Skorpik, Turbomachine, Aug. 2009 [last updated Jan. 29, 2017] (Year: 2017).*
Concise Encyclopedia of Composite Materials (2nd Edition), 2007 (Year: 2007).*
Corrosion: Fundamentals, Testing, and Protection, 2003, ASM Handbook, vol. 13A (Year: 2003).*
Handbook of Composite Reinforcements, 1993 (Year: 1993).*
Negahdari et al., Mechanical properties of dense to porous alumina/lanthanum hexaaluminate composite ceramics, Jan. 15, 2010, Materials Science and Engineering A, 3005-3009 (Year: 2010).*
Alpha-Alumina MSDS Melting Point Boiling Point Density Storage Transport, Chemical Book (Year: 2019).*
Silica-Silicon Dioxide, May 15, 2011, AZOm.com (Year: 2011).*
Polishing suspensions, Baikowskimalakoff.com (Year: 2019).*
Akbulut et al., Mechanical Behavior and Wear Resistance of Ce—PSZ Alumina Matrix Composites, May 15, 2004 (Year: 2004).*
Physical Constants of Inorganic Compounds, Knovel Sampler (Year: 2019).*
Abstract: Mohan, P.; et al., "Electrophoretically deposited alumina as protective overlay for thermal barrier coatings against CMAS degradation", Surface and Coatings Technology, vol. 204 (Heft 6-7), pp. 797-801, 2009.
Abstract: Chen Zheng et al., "Effect of Al2O3 overlay on hot-corrosion behavior of yttria-stabilized zirconia coating in molten sulfate-vanadate salt", Thin Solid Films (Oct. 22, 2003), vol. 443, No. 1-2, pp. 46-52.
Abstract: Mao, S X, "Impermeable thin Al2O3 overlay for TBC Protection from Sulfate and Vanadate Attack in Gas Turbines", Final Report, Sep. 1, 2001-Aug. 31, 2005; Sponsored by Department of Energy, Washington, DC.; Performer: Pittsburgh Univ., PA. Dept. of Mechanical Engineering.

* cited by examiner

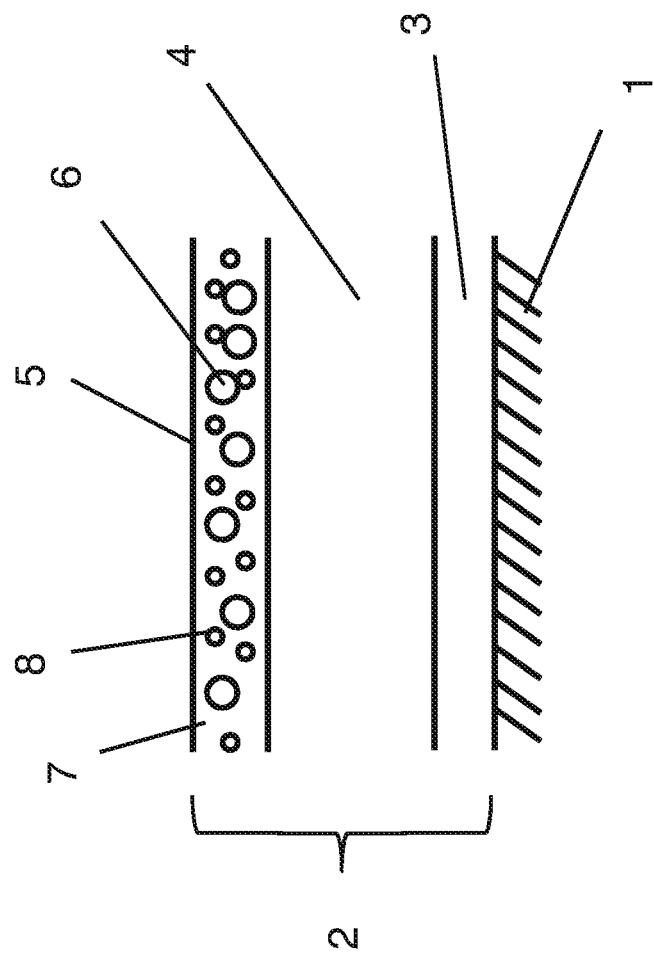

THERMAL BARRIER COATING WITH HIGH CORROSION RESISTANCE

CROSS-REFERENCE TO RELATED APPLICATIONS

The present application claims priority under 35 U.S.C. § 119 of German Patent Application No. 102016201947.3, filed Feb. 10, 2016, the entire disclosure of which is expressly incorporated by reference herein.

BACKGROUND OF THE INVENTION

1. Field of the Invention

The present invention relates to a thermal barrier coating system and also to a method for producing a thermal barrier coating system for metal components of a turbomachine, especially for high temperature-stressed or hot gas-stressed components of a turbomachine or of an aero engine.

2. Discussion of Background Information

Turbomachines such as stationary gas turbines or aero engines are operated at the highest possible temperatures for increasing efficiency, wherein the components which are installed in hot gas regions of the turbomachine, such as combustion chambers or the high-pressure turbine, frequently also need to additionally have a high level of mechanical strength, like diffuser blades or impeller blades. In order to achieve this, the metal components on the one hand are cooled and on the other hand are provided with thermal barrier coatings in order to minimize the effective operating temperatures for the metal materials being used.

As thermal barrier coatings, use is made of ceramic coatings, such as coatings of yttrium-stabilized zirconium oxide which are frequently applied to a adhesion promoting coating of the composition MCrAlY, with M being equal to Fe, Ni and/or Co, wherein the adhesion promoting coating brings about not only good adhesion of the ceramic coating on the metal substrate or component but in addition also has an anti-oxidation effect.

Especially in the case of aero engines which are frequently operated in regions in which a large amount of dust or sand particles are present in the air, such as desert regions or the like, the problem occurs, however, of the inducted dust or sand particles melting in the combustion chamber and penetrating into the thermal barrier coating along open pores or microflaws. This leads to a buildup of stresses inside the coating which can lead to a failure of the thermal barrier coating and, with a loss of the thermal barrier coating, also to a component failure. The sand particles or dust particles are frequently referred to as CMAS contaminants, wherein CMAS stands for Calcium, Magnesium, Aluminum and their oxides and silicates.

For avoiding such damage to thermal barrier coatings, proposals which inter alia comprise the provision of an outer sacrificial oxide coating (see U.S. Pat. No. 5,660,885, the entire disclosure of which is incorporated by reference herein) and especially an outer aluminum oxide coating on a thermal barrier coating (see U.S. 2011/0151219 A1, the entire disclosure of which is incorporated by reference herein) have already been put forward. However, such cover oxide coatings alter the mechanical properties of the coating system so that on account of different thermal expansion coefficients stresses can occur in the coating system and can also lead to a failure of the coating. Also, as a result of the increasing thickness of the entire coating system unfavorable mechanical properties of the coating system can occur. Therefore, in the case of pure aluminum oxide coatings as a cover oxide coating or sacrificial oxide coating, as proposed in U.S. 2011/0151219 A1, the low thermal expansion of the aluminum oxide coating leads to stresses inside the coating bond so that a coating failure can be caused as a result of these stresses. Accordingly, in document U.S. 2011/0151132 A1, the entire disclosure of which is incorporated by reference herein, it has also been proposed to provide titanium dioxide in addition to the aluminum oxide in the cover coating.

Overall, however, a compromise has to be found between mechanical properties of the coating system and corrosion protection and broader boundary conditions such as manufacturability, operating reliability, etc. This leads to further efforts for the improvement of thermal barrier coating systems being required for the desired improvement of service life and corrosion.

In view of the foregoing, it would be advantageous to have available a thermal barrier coating system for metal components of a turbomachine which has a long service life even in highly corrosive conditions, especially like environmental conditions with a high proportion of dust and sand. The corresponding measures for this would be intended to be implementable in a simple manner and the characteristic profile of the corresponding components should not be negatively influenced.

SUMMARY OF THE INVENTION

The present invention provides a thermal barrier coating system for a component of a turbomachine, especially for high temperature-stressed or hot gas-stressed component of a turbomachine. The system comprises a ceramic coating of fully or partially stabilized zirconium oxide, and an oxide cover coating which comprises aluminum and one or more elements selected from lanthanum, magnesium, silicon, calcium, and sodium. A oxide exists at least partially as free $\alpha$-$Al_2O_3$.

In one embodiment of the system, the oxide cover coating may comprise at least about 50 vol.-%, e.g., at least about 60 vol.-%, or at least about 90 vol.-% of aluminum oxide and/or the oxide cover coating may comprise at least about 50 vol.-%, e.g., at least about 60 vol.-% or at least about 90 vol.-% of $\alpha$-$Al_2O_3$.

In another embodiment, the oxide cover coating may comprise at least lanthanum.

In yet another embodiment, the oxide cover coating may have a porosity of from 5 to 30 vol.-%, e.g., of from 10 to 25 vol.-%.

In a still further embodiment, the thermal barrier coating system may comprise an adhesion promoting coating and/or an anti-oxidation coating on the side of the ceramic coating which faces away from the oxide cover coating.

In another embodiment, the oxide coating system may have a coating thickness of not more than 750 µm, e.g., not more than 500 µm and/or the oxide cover coating may have a thickness of from 50 µm to 250 µm.

The present invention also provides a component of a turbomachine which comprises the thermal barrier coating system as set forth above (including the various aspects thereof).

In one aspect, the component may be a component of a combustion chamber or of a high-pressure turbine and/or may be a diffuser blade or an impeller blade.

The present invention also provides a method for producing a thermal barrier coating system, e.g., the system set forth above. The method comprises applying a ceramic coating of fully or partially stabilized zirconium oxide to a substrate or to an adhesion promoting coating on the substrate by, e.g., thermal spraying or electron beam physical vapor deposition, followed by applying an oxide cover coating which comprises aluminum and at least one element selected from lanthanum, magnesium, silicon, calcium, and sodium to the ceramic coating by, e.g., thermal spraying or electron beam physical vapor deposition, and, after application of the oxide cover coating, subjecting the thermal barrier coating system to a heat treatment so that free α-$Al_2O_3$ exists in the oxide cover coating.

In one aspect of the method, the deposition parameters of the oxide cover coating may be selected to afford a porosity of the oxide cover coating of from 10 vol.-% to 25 vol.-%.

As set forth above, the present invention proposes to provide an oxide cover coating on a thermal barrier coating with a ceramic coating consisting of fully or partially stabilized zirconium oxide, which oxide cover coating, in addition to aluminum oxide, comprises at least one element from the group which includes lanthanum, magnesium, silicon, calcium and sodium, wherein in addition the aluminum oxide exists at least partially as free α-aluminum oxide. The chemical elements lanthanum, magnesium, silicon, calcium and sodium, in common with the aluminum, exist in oxidized form, wherein, however, the modification in which the respective element exists can be different. Therefore, the elements can exist in the form of their respective oxides and/or as aluminates or comparable complex compounds. Such a thermal barrier coating has good corrosion resistance to CMAS deposits and furthermore has the required mechanical properties, especially for a temperature change operation as is customary in the case of aero engines, in order to guarantee a long service life. As a result of the free aluminum oxide, which exists in separate phases with aluminum oxide structure and is not integrated in another structure with the further constituents of the oxide coating, such as aluminates, especially lanthanum hexaaluminate or the like, at least some of the aluminum oxide which is present in the oxide cover coating is directly provided for reaction with CMAS deposits and consequently can bring about an effective corrosion protection. The aluminum oxide existing as a separate phase with aluminum oxide structure is therefore understood by "free" with regard to the aluminum oxide in the oxide cover coating. At least some of the aluminum oxide exists in the α-modification which is thermally stable so that transformations and volumetric changes which accompany them and also stresses during a temperature change operation which result therefrom can be avoided.

The oxide cover coating may comprise at least about 50 vol.-%, e.g., at least about 60 vol.-%, such as at least about 90 vol.-% of aluminum oxide, wherein the aluminum oxide can exist both as free aluminum oxide and as aluminum oxide in a complex structure, such as lanthanum hexaaluminate. Furthermore, the oxide cover coating may comprise at least about 50 vol.-%, e.g., at least about 60 vol.-%, such as about 90 vol.-% of α-aluminum oxide which is thermally stable and therefore does not induce structure/volumetric changes which could lead to undesirable mechanical stresses in the coating. The overall free aluminum oxide may generally exist as α-aluminum oxide.

Owing to the addition of lanthanum into the oxide cover coating, the reaction inclination of the oxide cover coating with the CMAS contaminants for building high-melting particles which correspondingly crystallize on the surface and do not infiltrate into the thermal barrier coating, can be increased, or at least maintained, with simultaneous improvement of the mechanical properties of the coating system.

For avoiding stresses and therefore for improving the mechanical stability of the coating system, the oxide cover coating may have a porosity of from about 5 vol.-% to about 30 vol.-%, e.g., from about 10 vol.-% to about 25 vol.-%.

Furthermore, for limiting the occurring mechanical stresses the total thickness of the oxide coating system, which comprises the thermal barrier coating consisting of zirconium oxide and the oxide cover coating, may be limited to a coating thickness of about 750 μm maximum, e.g., about 500 μm maximum, wherein the oxide cover coating may especially have a thickness in the region of from about 50 μm to about 250 μm.

The thermal barrier coating system may additionally comprise an adhesion promoting coating and/or an anti-oxidation coating which can be provided as an actual thermal barrier coating between the substrate, upon which the thermal barrier coating system is applied, and the ceramic coating. The adhesion promoting coating and/or anti-oxidation coating may especially be an aluminizing coating with or without addition of platinum, or a MCrAly coating with M representing iron, nickel and/or cobalt.

For producing a corresponding thermal barrier coating system, both the ceramic coating consisting of zirconium oxide and the oxide cover coating may, for example, be applied by means of thermal spraying or electron beam physical vapor deposition (EB-PVD). For establishing a corresponding porosity of the oxide cover coating the parameters may be correspondingly selected in the coating deposit.

For forming the α-modification of the free aluminum oxide in the oxide cover coating, the thermal barrier coating may be subjected to a suitable heat treatment so that the thermally stable α-aluminum oxide is formed.

BRIEF DESCRIPTION OF THE DRAWING

The attached FIGURE shows in a purely schematic manner a sectional view through an exemplary embodiment of a thermal barrier coating system according to the invention.

DETAILED DESCRIPTION OF EMBODIMENT OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention in more detail than is necessary for the fundamental understanding of the present invention, the description in combination with the drawing making apparent to those of skill in the art how the several forms of the present invention may be embodied in practice.

The attached FIGURE shows in a cross section an example of a thermal barrier coating system according to the invention which is applied to a substrate 1. In the case of the substrate 1 it can be a metal component of a turbomachine, such as of an aero engine, which is formed from an iron-based, nickel-based or cobalt-based alloy, or from other high temperature-resistant materials, such as titanium aluminide and alloys thereof or high temperature-resistant composite materials. The component can be a component made from a high temperature-stressed or hot gas-stressed region of a turbomachine, such as a component of the combustion chamber or of the high-pressure turbine. The component can especially be blades such as diffuser blades or impeller blades of the high-pressure turbine of an aero engine.

The depicted thermal barrier coating system 2 comprises an adhesion promoting coating 3, a thermal barrier coating 4, in the form of a ceramic coating, and an oxide cover coating 5.

The adhesion promoting coating 3, which at the same time can also have the function of an anti-oxidation coating, can for example be formed by means of a so-called MCrAlY coating, wherein M stands for iron, cobalt and/or nickel. Alternatively, it can also be an aluminizing coating or PtAl diffusion coating, therefore an aluminizing coating with Pt additive, in which aluminum, or platinum and aluminum, is, or are, diffused into the edge region of the substrate 1.

On the adhesion promoting coating 3, provision is made for the actual thermal barrier coating 4 in the form of a ceramic coating which in the depicted example is formed from a zirconium oxide coating which is stabilized with yttrium oxide.

Formed above the ceramic coating 4 is an oxide cover coating 5 which comprises aluminum, lanthanum and magnesium, wherein the corresponding elements can exist in an aluminate, such as a lanthanum hexaaluminate 7 which forms a matrix of the oxide cover coating 5. In addition, free aluminum oxide particles 6 are embedded into the oxide cover coating 5. Furthermore, free magnesium oxide particles and/or lanthanum oxide particles (not shown) can also be present.

The aluminum oxide which is contained in the oxide cover coating 5 is formed at least partially as α-aluminum oxide, wherein at least some, or preferably all, of the free aluminum oxide particles exist in the modification of α-aluminum oxide.

The volumetric proportion of the aluminum oxide, especially α-aluminum oxide, which is contained in the oxide cover coating is at least about 60 vol.-%.

Owing to the provision of the α-aluminum oxide particles 6 in the oxide cover coating 5, the so-called CMAS particles, which on account of the high temperature make their way onto the oxide cover coating 5 in molten form, can react with the free α-aluminum oxide forming a higher melting phase called anorthite so that penetration of the CMAS contaminants into the thermal barrier coating 4 is avoided. As a result, damage to, or impairment of, the thermal barrier coating 4 can be avoided and the service life and corrosion resistance of the thermal barrier coating system 2 is improved.

For improving the mechanical properties of the thermal barrier coating system 2 and especially of the oxide cover coating 5, pores 8 are formed in the oxide cover coating.

Although the present invention has been described in detail based on the exemplary embodiment, the invention is not limited to this exemplary embodiment, but rather modifications are possible in a way in which individual features can be omitted or different combinations of features can be implemented providing the extent of protection of the attached claims is not deserted. The present disclosure includes all the combinations of the represented individual features.

LIST OF REFERENCE NUMERALS

1 Substrate, component
2 Thermal barrier coating system
3 Adhesion promoting coating and/or anti-oxidation coating
4 Thermal barrier coating, ceramic coating
5 Oxide cover coating
6 Aluminum oxide particles
7 Lanthanum hexaaluminate
8 Pores

What is claimed is:

1. A thermal barrier coating system which is suitable for a component of a turbomachine, wherein the thermal barrier coating system comprises a ceramic coating of fully or partially stabilized zirconium oxide and an oxide cover coating in direct contact with the ceramic coating as an outermost coating which comprises aluminum oxide and at least one element selected from lanthanum, magnesium, silicon, calcium, and sodium, the oxide cover coating having a porosity of from 5 to 30 vol. %, comprising at least 50 vol. % of the aluminum oxide which exists at least partially as free α-$Al_2O_3$, and having been produced by a method which comprises applying the oxide cover coating which comprises the aluminum oxide and the at least one element selected from lanthanum, magnesium, calcium, silicon, and sodium to the ceramic coating by thermal spraying or electron beam physical vapor deposition, and, after application of the oxide cover coating, subjecting the thermal barrier coating system to a heat treatment so that free α-$Al_2O_3$ exists in the oxide cover coating.

2. The thermal barrier coating system of claim 1, wherein the oxide cover coating comprises at least 90 vol. % of the aluminum oxide.

3. The thermal barrier coating system of claim 2, wherein the porosity of the oxide cover coating is from 10 to 30 vol. %.

4. The thermal barrier coating system of claim 1, wherein the oxide cover coating comprises at least 90 vol. % of the α-$Al_2O_3$.

5. The thermal barrier coating system of claim 1, wherein the porosity of the oxide cover coating is from 10 to 30 vol. %.

6. The thermal barrier coating system of claim 1, wherein the porosity of the oxide cover coating is from 10 to 25 vol. %.

7. The thermal barrier coating system of claim 1, wherein the thermal barrier coating system comprises an adhesion promoting coating and/or an anti-oxidation coating on a side of the ceramic coating which faces away from the oxide cover coating.

8. The thermal barrier coating system of claim 1, wherein the ceramic coating and the oxide cover coating have a total thickness of not more than 500 μm.

9. The thermal barrier coating system of claim 8, wherein the oxide cover coating has a thickness of from 50 μm to 250 μm.

10. The thermal barrier coating system of claim 1, wherein the oxide cover coating comprises aluminum and at least lanthanum.

11. The thermal barrier coating system of claim 1, wherein the oxide cover coating comprises aluminum and at least one of lanthanum and magnesium.

12. The thermal barrier coating system of claim 1, wherein the oxide cover coating comprises a matrix of lanthanum hexaaluminate that has free aluminum oxide particles embedded therein.

13. The thermal barrier coating system of claim 12, wherein the lanthanum hexaaluminate matrix further has free particles of magnesium oxide embedded therein.

14. The thermal barrier coating system of claim 13, wherein the lanthanum hexaaluminate matrix further has free particles of lanthanum oxide embedded therein.

15. The thermal barrier coating system of claim 12, wherein the lanthanum hexaaluminate matrix further has free particles of lanthanum oxide embedded therein.

16. The thermal barrier coating system of claim 12, wherein the oxide cover coating comprises at least 90 vol. % of the aluminum oxide.

17. The thermal barrier coating system of claim 12, wherein the oxide cover coating comprises at least 90 vol. % of the $\alpha$-$Al_2O_3$.

18. The thermal barrier coating system of claim 12, wherein pores are present in the oxide cover coating.

19. A component of a turbomachine, wherein the component comprises the thermal barrier coating system of claim 1.

20. The component of claim 19, wherein the component is a diffuser blade or an impeller blade.

* * * * *